United States Patent
Shibata

[11] Patent Number: 5,471,097
[45] Date of Patent: Nov. 28, 1995

[54] RESIN ENCAPSULATED SEMICONDUCTOR DEVICE WITH AN ELECTRICALLY INSULATING SUPPORT AND DISTORTION PREVENTING MEMBER

[75] Inventor: Kazutaka Shibata, Kyoto, Japan

[73] Assignee: Rohm Co., Ltd., Kyoto, Japan

[21] Appl. No.: 303,597

[22] Filed: Sep. 9, 1994

Related U.S. Application Data

[63] Continuation of Ser. No. 12,655, Feb. 3, 1993, abandoned.

[30] Foreign Application Priority Data

Feb. 7, 1992 [JP] Japan .................................. 4-022650
Sep. 8, 1992 [JP] Japan .................................. 4-239495

[51] Int. Cl.$^6$ ........................ H01L 23/48; H01L 29/44; H01L 29/52; H01L 29/60
[52] U.S. Cl. ..................... 257/787; 257/666; 257/669; 257/670; 257/671; 257/696; 361/813
[58] Field of Search ................... 257/666, 671, 257/693, 696, 787, 670, 668, 669; 361/813

[56] References Cited

U.S. PATENT DOCUMENTS 4,796,080  1/1989  Phy ........................................ 257/671
5,051,813  9/1991  Schneider et al. ....................... 257/693
5,176,366  1/1993  Masumoto et al. ..................... 257/670
5,281,851  1/1994  Mills et al. .............................. 257/670
5,285,104  2/1994  Kondo et al. ........................... 257/666

Primary Examiner—Sara W. Crane
Assistant Examiner—Carl Whitehead, Jr.
Attorney, Agent, or Firm—Nikaido, Marmelstein, Murray & Oram

[57] ABSTRACT

A semiconductor device encapsulated with a synthetic resin portion, includes a semiconductor chip, a plurality of leads each electrically connected at one end thereof to the semiconductor chip and bent to have a gull-wing like shape extending outwardly from the synthetic resin portion, and an insulating support member provided in a flat portion nearer to the resin portion than a bottom soldering face of the leads of the gull-wing like shape. The leads are fixed to each other by means of the insulating support member. The semiconductor device has an improved lead alignment even if the leads are each very thin and aligned with fine pitch. Such a semiconductor device can be assuredly mounted on a printed board or the like with ease together with mounting the semiconductor device on the printed board type components, thereby contributing to acquisition of a highly reliable electronic device.

5 Claims, 7 Drawing Sheets

RESIN ENCAPSULATED SEMICONDUCTOR DEVICE WITH AN ELECTRICALLY INSULATING SUPPORT AND DISTORTION PREVENTING MEMBER

This application is a continuation of application Ser. No. 08/012,655 filed Feb. 3, 1993 now abandoned.

BACKGROUND OF THE INVENTION

The present invention relates to a semiconductor device and a method for producing the same. More particularly, it relates to a semiconductor device having fine lead wires (hereinafter refer to as leads) with narrow pitch, wherein the leads are aligned with good dimensional precision for facilitating the mounting of the device on a circuit board, and a method for producing the same.

BACKGROUND OF THE INVENTION

With the recent down-sizing and high-performance trend of electronic devices, especially personal computers and lap-top type computers, semiconductor devices to be used therein need to have a higher integration and miniaturized size. Accordingly, the semiconductor devices are each provided with an increased number of fine leads with narrowed pitch. As a matter of course, the strength of the leads is weakened, and a slight deformation of a lead causes the lead to come into contact with an adjacent lead undesirably. Thus, lead deformation becomes a problem to be solved.

A conventional semiconductor device of this type, like a conventional semiconductor device of the type having leads with wide pitch, is produced by steps wherein a semiconductor chip is bonded with a lead frame, then encapsulated (or molded) with a synthetic resin, and is produced by steps for cutting off the leads from the lead frame, and forming or shaping the remaining leads. The device thus formed is then subjected to electric property checking. At this time, the problem of lead deformation comes to the fore with the device having fine-pitch leads. Then, deformation of the leads, particularly the coplanarity thereof (i.e. ups and downs of lead tips) is checked with a scanner utilizing reflection of laser beam or image processing. If lead deformation is found out, the device would need to be reformed.

With the recent trend of providing leads with finer pitch, a better dimensional precision is required for the coplanarity of leads. Specifically, 0.5 mm-pitch leads require a coplanarity of about 0.1 mm, while 0.3 mm-pitch leads require a coplanarity of about 50 μm.

To meet these requirements, there is a practice for conducting the forming step prior to the step for cutting off the leads from a lead frame. However, the leads have to be cut off prior to the electric property checking; accordingly, possible deformation occurring in subsequent steps such as the electric property checking step is unavoidable. For this reason, there might be a case where 100% inspection has to be carried out with a scanner and the products unconformable to a standard have to be reformed to meet the standard. Therefore, a large number of scanners should be equipped and furthermore the number of checking steps increases. This results in a rise in production cost. To avoid lead deformation in the electric property checking step, it is conceivable to employ a probe checking system for the electric property checking step, wherein measurement is achieved only by contacting a probe with the semiconductor device. However, this also requires further equipment, thus raising the running cost.

Further, if 100% inspection is carried out as described above, delivery term is prolonged because of increased and complicated checking steps. Besides, it is difficult to completely reform the leads once deformed. Furthermore, stress is generated on the leads upon reforming thereby to crack the leads or damage a sheath of the device such as a :plating layer covering each lead. This leads to an increased number of defective products or lessening the reliability of products. In addition, there is a problem of deformation caused by handling during shipment and transportation or handling before use.

There has been disclosed in Japanese Unexamined Patent Publications Nos. 78249/1990 and 199857/1990 an art of jointedly fixing outside leads by means of an insulating tape or the like for avoiding lead deformation upon checking or mounting, or during conveyance or transportation of products. Specifically, the former publication (No. 78249/1990) discloses an art of joining the end portions of leads projecting from a package by means of a flux material that can be melted on mounting the semiconductor device on the printed board, or by means of insulating tape such as a polyimide tape which is applied on the upper side of the end portions of leads. The latter publication (No. 199857/1990), although it does not disclose a concrete art, mentions that outside leads are secured to each other with an insulating material or fixed to each other by means of an insulating tape.

With the above-mentioned art of joining the end portions of leads by means of a flux material, however, the flux material needs to be applied on the reverse side of the end portions of the leads. Accordingly, once a upward force is exerted on one of the leads, the lead is easily released from the flux material and hence deformed.

When joining the end portions of leads at the upper side thereof by means of an insulating tape, since the reverse side of the end portions of leads is usually intended to be soldered to a printed board or the like when the device is mounted, a solder bridge can be formed in a narrow space between adjacent leads through intermediation of the insulating tape, to cause frequent occurrence of short-circuit between the adjacent leads. In more detail, the solder used for soldering the end portion of a lead can flow along the insulating tape to the end portion of an adjacent lead to make a connection therebetween because the space between the printed board and the insulating tape is less than the thickness. (usually about 0.10 to about 0.15 mm) of the lead while at the same time the lead pitch is as narrow as, for example, 0.125 to 0.3 mm.

In view of the above-mentioned circumstances, an object of the present invention is to provide a highly reliable semiconductor device and a method for producing the same, wherein lead deformation can be prevented as much as possible in a production process while the number of production steps is reduced, and the lead deformation does not occur and a problem of short-circuit between the leads does not arise even when the semiconductor device is mounted on the printed board.

SUMMARY OF THE INVENTION

According to the present invention, there is provided a semiconductor device comprising a semiconductor chip, a plurality of leads each electrically connected at one end thereof to the semiconductor chip, a synthetic resin portion which encapsulates the semiconductor chip and one end of leads, and an insulating support member.

Another end of the leads is bent to have a gull-wing like shape extending outwardly from the synthetic resin portion.

The insulating support member is provided in a flat portion nearer to the synthetic resin portion than a bottom soldering face of the leads of the gull-wing like shape. The leads are fixed to each other.

According to the present invention, there is also provided a semiconductor device comprising a semiconductor chip, a plurality of leads each electrically connected at one end thereof to the semiconductor chip, a synthetic resin portion which encapsulates the semiconductor chip and the one end of leads, and an insulating support member.

Another end of the leads is extended outwardly from the synthetic resin portion.

The insulating support member is formed integrally with the synthetic resin portion at a root portion of the leads extending from the synthetic resin portion and is made of the same material as that of the synthetic resin portion encapsulating the semiconductor device. The leads are fixed to each other.

It is preferable that the insulating support member formed integrally with the synthetic resin portion is provided with a notch portion.

According to the present invention, there is yet provided a semiconductor device comprising a semiconductor chip, a plurality of leads each electrically connected at lone end thereof to the semiconductor chip, a synthetic resin portion which encapsulates the semiconductor chip and the one end of leads, and an insulating support member.

Another end of the leads is like bent to have a gull-wing like shape extending outwardly from the synthetic resin portion. A tip portion of the another end of the leads is further bent upwardly. The insulating support member is provided in the up-bent end of the leads. The leads are fixed to each other.

According to the present invention, there is still provided a semiconductor device comprising a semiconductor chip, a plurality of leads each electrically connected at one end thereof to the semiconductor chip, a synthetic resin portion which encapsulates the semiconductor chip and the one end of leads, and an insulating support member.

Another end of the leads is bent to have a gull-wing like shape extending outwardly from the resin portion.

The insulating support member is formed of a solidified material and is provided on the front side of a flat bottom portion of the leads in the gull-wing like shape. The leads are fixed to each other by means of the insulating support member. A concave or convex portion is formed on a reverse side of the insulating support member in a space between adjacent two of the leads.

According to the present invention, there is yet still provided a method for producing a semiconductor device, wherein a semiconductor chip is electrically connected to end portions of a plurality of leads of a lead frame; the semiconductor chip and the end portions of the leads are encapsulated with a synthetic resin portion; and the leads are each, cut off from the lead frame to remove an unnecessary portion thereof.

The method includes forming an insulating support member at the same time with the encapsulation with use of a synthetic resin to jointedly fix the leads.

According to the present invention, there is still yet provided a method for producing a semiconductor device, wherein a semioconductor chip is electrically connected to end portions of a plurality of leads of a lead frame; the semiconductor chip and the end portions of the leads are encapsulated with a synthetic resin portion; and the leads are each cut off from the lead frame to remove an unnecessary portion thereof.

The method includes a) forming an insulating support member in a portion of the leads extending outwardly from the synthetic resin portion to jointedly fix the leads at any step prior to the step of cutting off the leads from the lead frame, and b) removing the insulating support member together with a portion of the leads in which the insulating support member is provided after the cutting-off step and an electric property checking step and before mounting the semiconductor device on a printed board.

Figure 1:
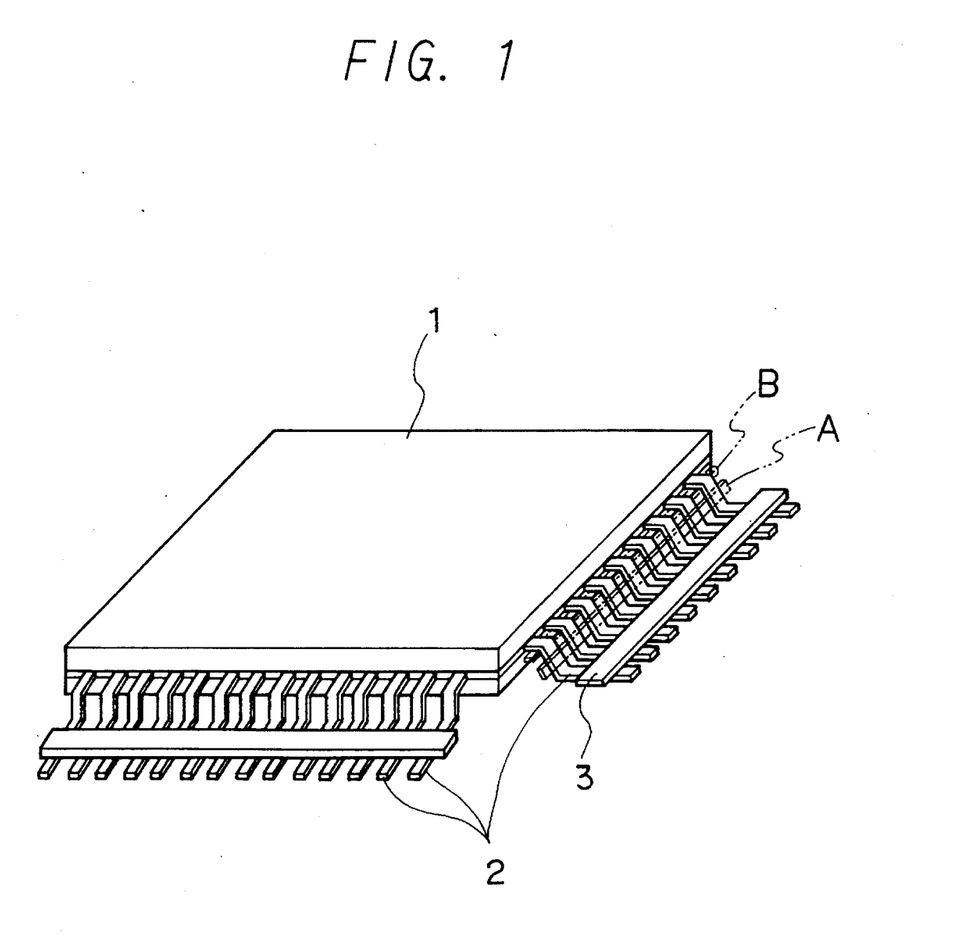
FIG. 1 is a perspective view showing a semiconductor device provided with an insulating support member according to one embodiment of the present invention.
Figure 4:
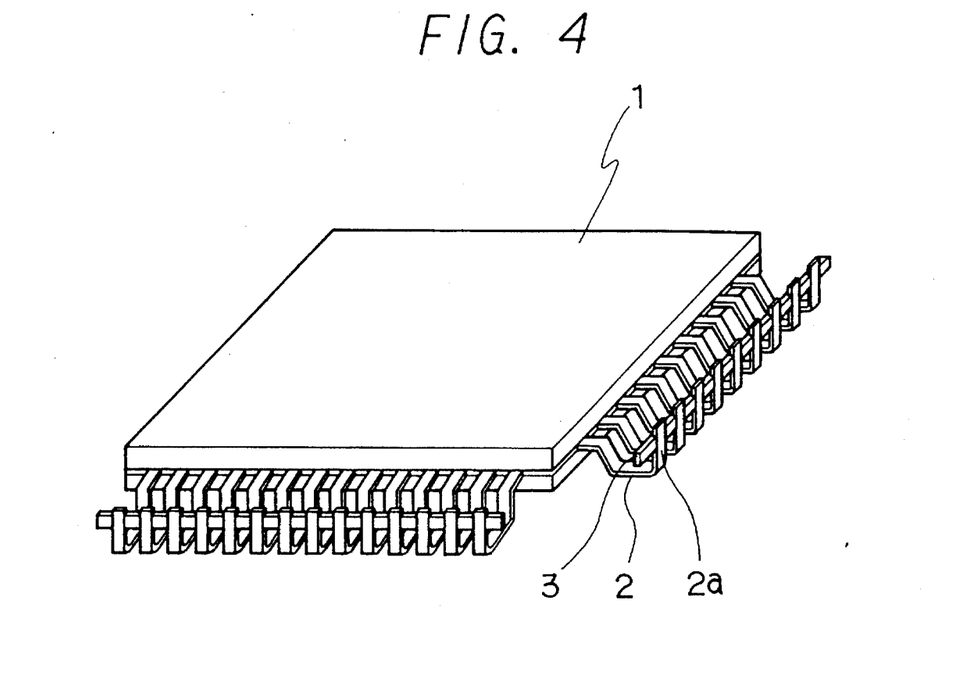
FIG. 4 is a perspective view showing a semiconductor device provided with an insulating support member according to yet another embodiment of the present invention.

In the present invention, the term "insulating" is meant by electrically insulating. In addition, the term "gull-wing like shape" is meant to have a shape wherein leads which extend outwardly are bent to have a face for soldering at the bottom of the shape, for example, as shown in FIG. 1. The face for soldering may be flat or curved, In addition, the outside ends of the leads can be further extended as shown in FIG. 4.

In the present invention, since the insulating support member fixes the outside end portions of the leads jointedly, the leads are hard to deform in the production process, even in the step of electric property checking in which the leads are usually prone to deform. In addition, the end portions of the leads which extend beyond the insulating support member are short and the electric property checking can be achieved only by making such portions contact with a socket; hence, the end portions of the leads are hard to deform. Even if they deform, they can finally be cut off together with the insulating support member. Accordingly, the necessary portions of the leads are substantially free from deformation.

Further, the insulating support member is so formed as not to become a hindrance to soldering for mounting the semiconductor device on a printed board or the like, with the result that the device can be mounted with leads thereof being fixed by means of the insulating support member. Hence, there is no room for an occurrence of lead deformation, so that the semiconductor device with the leads in improved alignment can be easily soldered to a printed board together with other components.

Furthermore, upon encapsulating or molding of the semiconductor chip with synthetic resin, the leads of the semiconductor device can be jointedly fixed, thereby reducing the number of steps for production.

In addition, the outside end portions of the leads fixed by the insulating support member can finally be cut off just before mounting of-the semiconductor device on a printed board; hence, a semiconductor device of the same shape as that of a conventional one can be obtained with the leads thereof being in improved alignment.

DETAILED DESCRIPTION

The present invention will be described in more detail with reference to the drawings. FIG. 1 is a perspective view showing a semiconductor device according to an embodiment of the present invention, wherein leads of the device are fixed with an insulating support member.

Referring to FIG. 1, numeral 1 denotes a package encapsulating with resin a semiconductor chip bonded to a lead frame and numeral 2 denote leads for drawing various functions of the chip out of the package 1, which leads are bent like a gull-wing. Numeral 3 denotes an insulating support member fixed to the leads 2 so as not to deform each of the leads 2, which can be obtained by, for example, allowing the same resin as that used for molding to stick to the leads 2 simultaneously with the molding, or applying to the leads 2 an insulating tape, for example, made of polyimide film or allowing a thermosetting resin or an adhesive to stick thereto when the lead frame is not yet mounted with the chip or at any step subsequent thereto and prior to cutting off each of the leads.

The lead frame as used in the semiconductor device in accordance with the present invention is formed of 42 Ni alloy thin plate having a thickness of for example, 0.125 mm and has leads 2 of about 0.1 mm wide, for example, 1 to 1.2 mm long ( eventually necessary length) and for example, 0.3 mm pitch. If the outside ends of the individual leads 2 are left free, the strength of the leads 2 becomes extremely low and a small external force would easily deform the leads 2. Particularly when performing measurements for checking the electric properties of the semiconductor device, wherein each lead of the device is inserted into a socket or the device is placed into an internal box of a so-called carrier, the leads 2 are easy to be deformed or damaged upon insertion. With the semiconductor device in accordance with the present invention, however, the leads 2 are jointedly fixed to each other at end portions thereof with the insulating support member 3, hence, the degree of freedom of each lead tip is not so high, thereby rendering the leads 2 hard to deform. Further, a row of leads is integrally fixed, and accordingly the strength against external force is greatly improved to avoid a occurrence of partial deformation.

If the portion of the leads 2 in which the insulating support member 3 is positioned is removed or cut off before the delivery of the device to a user or upon use by the user so that the device is made ready to be soldered, there is no intermediate step between the cutting-off and the use by the user, hence, there is no chance for lead deformation, with the result that the device having leads aligned with high precision can assuredly be mounted on a printed board or the like. Otherwise, if there is a good spatial margin for mounting the device, the device can be commercialized as a semiconductor device without removing the insulating support member. When using the semiconductor device with the insulating support member retained, the leads need to be jointedly fixed at the middle or root portion thereof by means of the insulating support member as indicated by A or B in FIG. 1, or they need to be further bent upwardly at the end portion thereof and jointedly fixed at the up-bent end portion 2a by means of the insulating support member so as to locate the insulating support member in a position spaced apart from the soldering face for mounting, as shown in FIG. 4. The reason therefor is as mentioned hereinafter. The leads are usually soldered at the reverse side of the bottom thereof to a printed board or the like, so even if they are jointedly fixed at the opposite or the front side of the bottom thereof by means of the insulating support member, the space between the face to be soldered and the insulating support member, or in other words, the thickness of the leads, is still as small as about 0.125 min. Accordingly, such a small space possibly causes the solder to form a solder bridge through intermediation of the insulating support member, resulting in short-circuit between the adjacent leads, provided that the solder is used in slightly larger amount than desired amount.

When removing or cutting off the end portions of the leads together with the insulating support member 3 before the delivery of the device or upon the use by the user, it is desirable that the insulating support member is positioned on the tip end side of the leads and just beyond the lead length needed for a commercialized product. It should be noted that although the insulating support member 3 can be formed on each side of the semiconductor device independently as shown in FIG. 1, the insulating support members 3 on the respective sides can be collectively jointed to further enhance the fixing strength.

Figure 6:
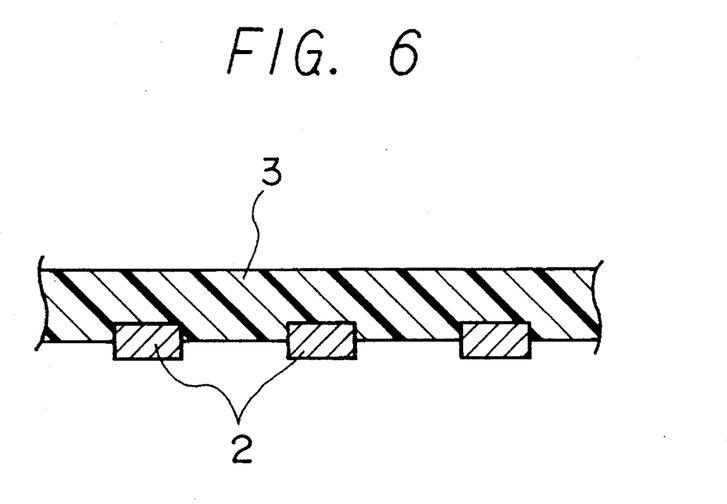
FIG. 6 is a fragmentary section for illustrating an example in which leads stick to an insulating support member.
Figure 7:
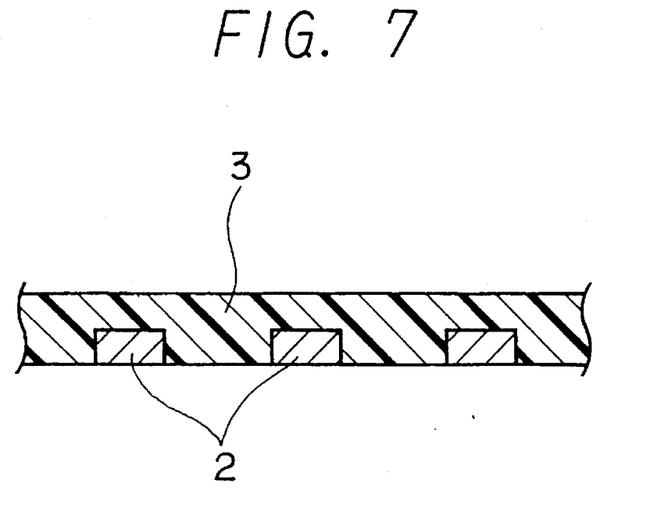
FIG. 7 is a fragmentary section for illustrating another example in which leads stick to an insulating support member.
Figure 8:
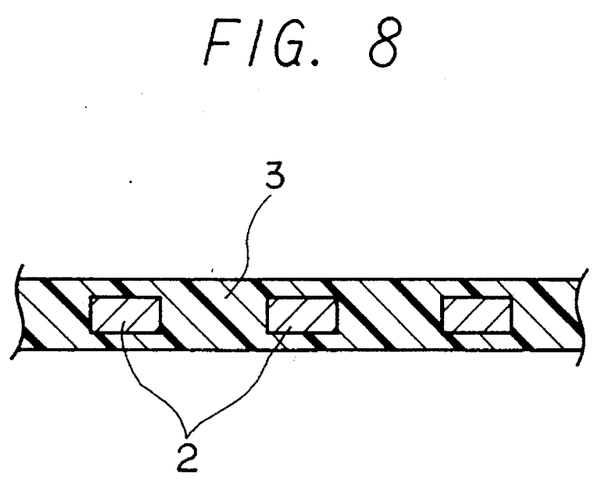
FIG. 8 is a fragmentary section for illustrating still another example in which leads stick to an insulating support member.

Further, the fixing the leads 2 by means of the insulating support member can be achieved by applying an insulating tape or the like onto only the surface of the leads as described above, or by covering the leads 2 to the lateral sides thereof with a synthetic resin or the like as shown in FIGS. 6 and 7 or completely encircling them with the same as shown in FIG. 8.

Next, the embodiment of the present invention wherein the semiconductor device is to be soldered to a printed board or the like without removing the insulating support member 3 upon use will be more fully described.

To mount the semiconductor device with its leads jointedly fixed by means of the insulating support member 3, it is necessary to prevent short-circuit between adjacent leads through the solder bridge as described above. Accordingly, the insulating support member 3 is positioned in a flat portion (indicated by A or B in FIG. 1) located nearer to one side of the package molded with synthetic resin than the soldering face or the lead end side.

This insulating support member 3 is preferably formed simultaneously with the molding of the package 1 using the same synthetic resin as that used for the molding because of unnecessity of any special process therefor, as described above. Otherwise, prior or posterior to the molding, the leads can be fixed together using a thermosetting resin such as epoxy resin or an insulating film.

When forming the insulating support member 3 in the position A in FIG. 1 prior to subjecting the leads to forming or shaping, it is preferable to form the insulating support member 3 so as not to protrude on the reverse side of the leads. In this case the insulating support member 3 can protrude in the space between adjacent leads or on the front side of the leads. This is because the projections of the insulating support member 3 on the front side of the lead would not hinder the forming or shaping of the leads using a cam. However, such a limitation does not have to be considered when the insulating support member is formed after the forming of the leads and the end portions of the leads are cut off from the lead frame.

Figure 2:
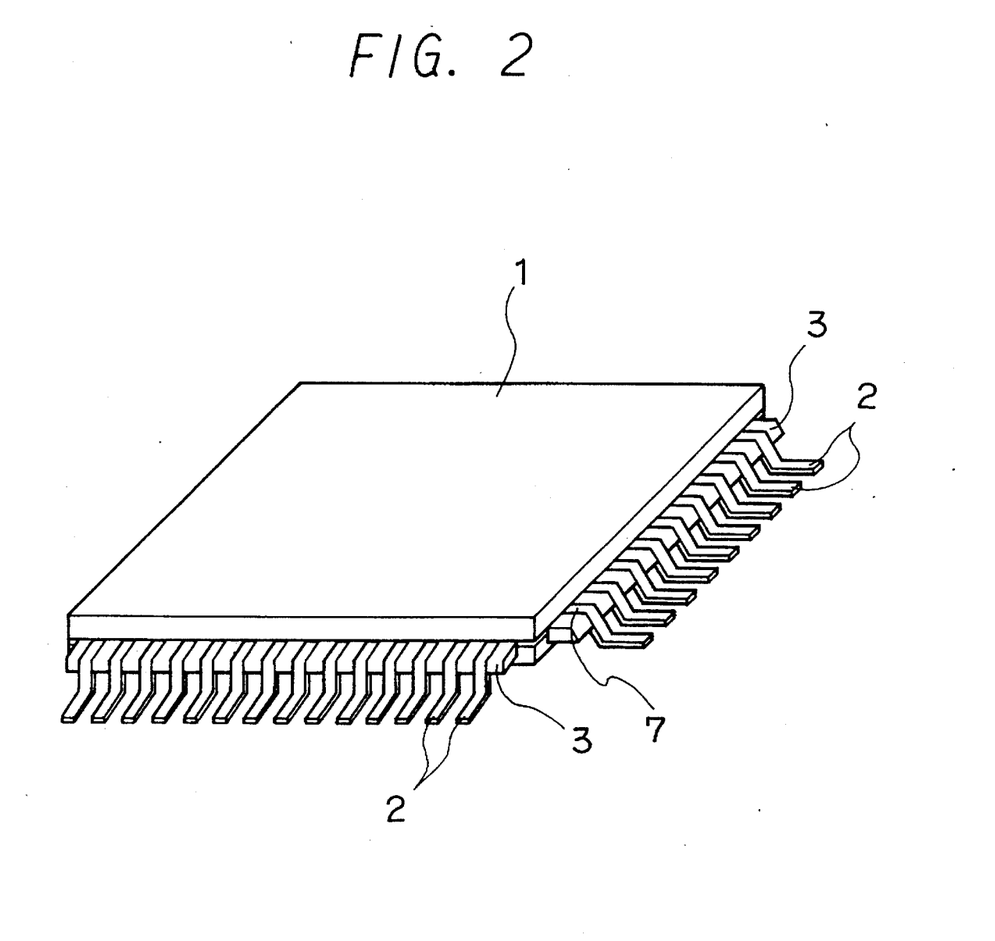
FIG. 2 is a perspective view showing a semiconductor device provided with an insulating support member according to another embodiment of the present invention.

When forming the insulating support member 3 in a root portion 7 of the leads extending from the package 1 as shown in FIG. 2, it is convenient to form the insulating support member 3 simultaneously with the molding of the package 1 using the same resin. Because a cavity for the insulating support member 3 can be formed integrally with a cavity for the package 1. Fixation of the leads at this position is particularly effective to avoid deformation because bending or deformation is tend to occur at the position with the edge of the package 1 serving as a fulcrum.

Figure 3:
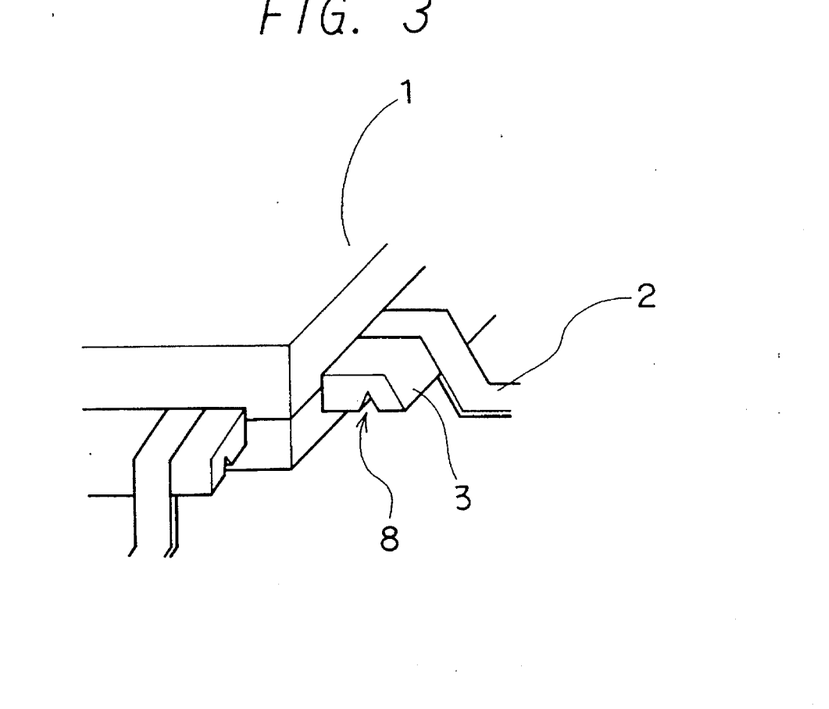
FIG. 3 is a perspective view partially showing a semiconductor device provided with an insulating support member according to still another embodiment of the present invention.

FIG. 3 shows a preferred embodiment of the embodiment shown in FIG. 2. FIG. 3 is a perspective view partially showing a semiconductor device according to still another embodiment of the present invention, wherein leads extending from a package are fixed at the root portion thereof with an insulating support member 3 formed simultaneously with the molding of the package using the same synthetic resin, and a notch portion (or cut out portion) 8 is provided in the support member 3 to assure a sufficient elasticity of the leads by improving the decreased elasticity of the fixed portion against external force.

FIG. 4 is a perspective view showing a semiconductor device according to yet another embodiment of the present invention, wherein the end portion of leads are extended beyond a flat soldering portion, bent upwardly and made to adhere to each other in the up-bent portion by the insulating support member 3. Such arrangement is highly resistant against external force because the leads are jointedly fixed, while short-circuit between adjacent leads will not be caused by the insulating support member 3. Further, there are additional effects that wetting for soldering can be achieved completely and soldering check can be easily and assuredly made.

Figure 5:
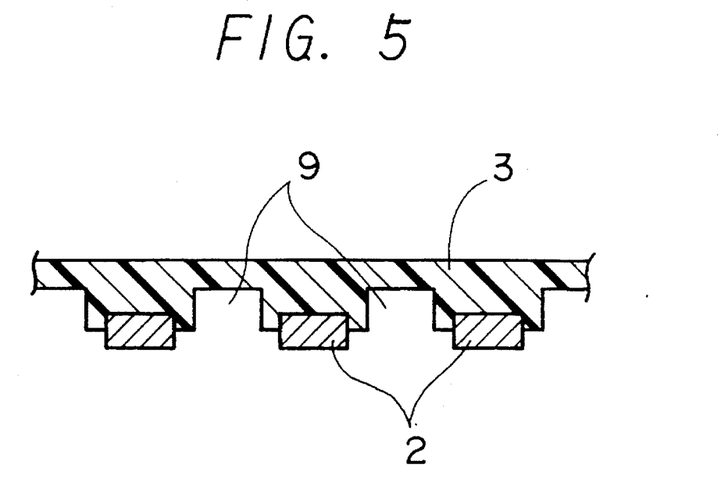
FIG. 5 is a fragmentary section showing a semiconductor device provided with an insulating support member according to yet another embodiment of present invention.

FIG. 5 is a fragmentary section showing the insulating support member 3 and leads of a semiconductor device according to yet still another embodiment of the present invention. In this embodiment the insulating support member 3 formed of a solidified material such as a synthetic resin for molding or thermosetting resin is made to adhere to the front side of a flat portion to be soldered, the flat portion being located in the bottom of leads each of which is bent so as to have a gull-wing like shape extending from a package 1 in which a semiconductor chip is encapsulated with resin; and concave portions 9 are each formed between adjacent leads to enlarge the distance therebetween, thereby avoiding short-circuit through a solder bridge. Therefore, the same effect can be obtained if convex portions are formed instead of the concave portions. The insulating support member 3 needs to be of a solidified material for forming the concave or convex portion; hence, an insulating tape is not suitable therefor.

Described next is a method for producing a semiconductor device according to the present invention.

Figure 9:
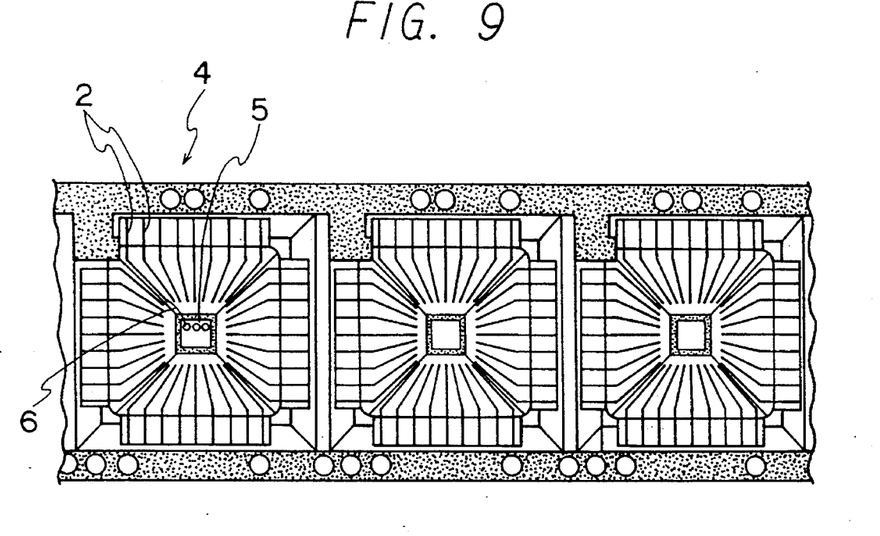
FIG. 9 is a plan view for illustrating a method for producing a semiconductor device according to an embodiment of the present invention.
Figure 10:
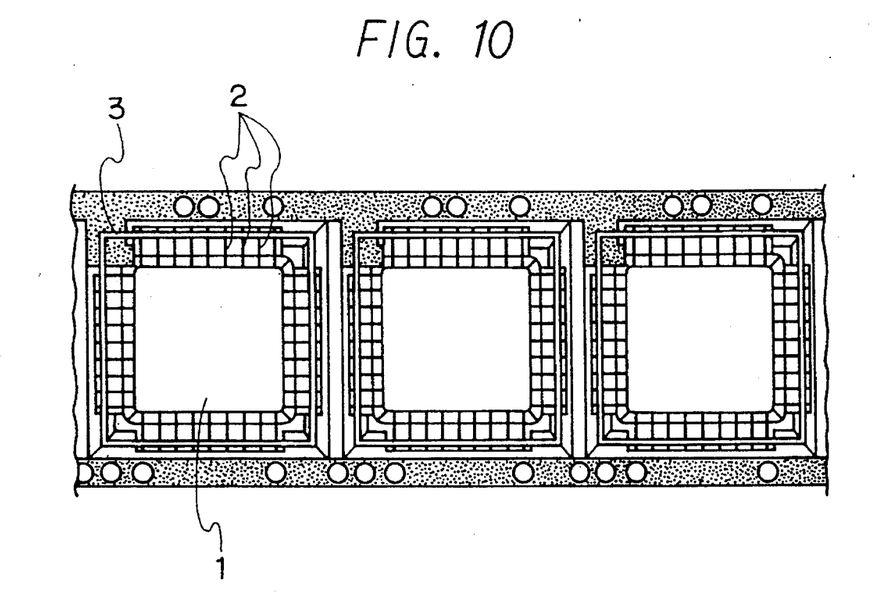
FIG. 10 is a plan view for illustrating a method for producing a semiconductor device according to an embodiment of the present invention.
Figure 11:
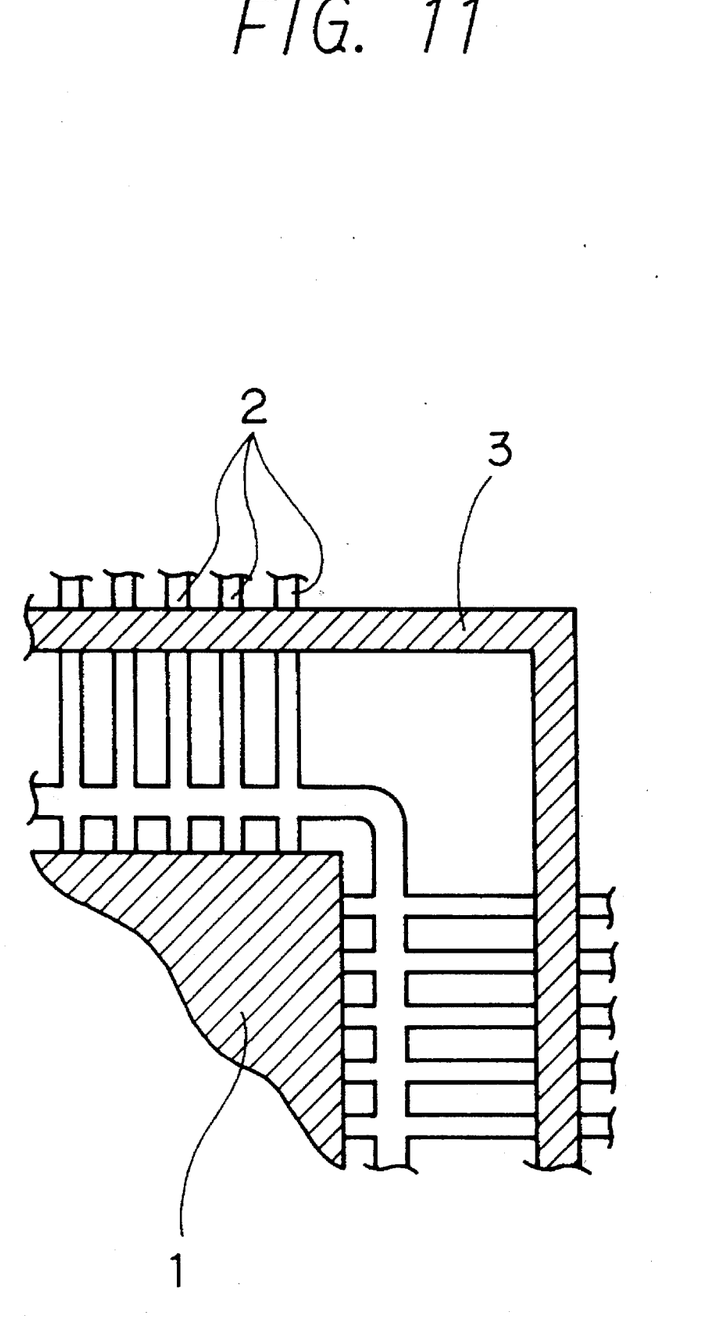
FIG. 11 is an enlarged fragmentary view showing an insulating support member of a semiconductor device according to an embodiment of the present invention.

As shown in FIG. 9, a semiconductor chip 5 is die-bonded to a lead frame 4 formed by punching or etching. The chip 5 is electrically connected to the inner end of each lead 2 by, for example, wire-bonding with a gold wire 6. Next, as shown in FIG. 10, molding of a resin portion 1 is performed to protect the semiconductor chip 5 and the wire-bonded portions. In this case, a groove portion is formed in a mold for the resin portion 1 to form an insulating support member 3 shaped in a strap which adheres to the leads 2 extending outwardly from the synthetic resin portion 1. Each lead 2 is secured to the insulating support member 3 in such a manner as shown in FIGS. 6 to 8 which is described hereinbefore.

In turn, each lead 2 is electrically isolated from another by cutting off a tie-bar of the lead frame 4 and a joint portion connecting one lead to another. In this case, the insulating support member 3 is retained as it is and each lead is cut off at a position spaced about 0.1 to about 12 mm outwardly from the insulating support member 3 so as to use the lead as a terminal for electric property measurement. Even if the semiconductor device is separated from the lead frame, the leads 2 are mechanically fixed by the insulating support member. When the leads 2 are separated from the lead frame 4, forming or shaping of the leads 2 can be achieved simultaneously with the separation. It depends on selection whether or not the leads are subjected to forming to obtain a desired shape suitable for the electric property checking.

Subsequently, the end portion of each lead of the semiconductor device is connected to a socket for electric property checking (not shown) to undergo the electric property checking. Although external force exerts on the end portion of the lead at this time, deformation of the lead is hard to occur because each lead 2 is supported in the proximity of the tip thereof by the insulating support member 3 and the end portion of the lead 2 is very short, thus resulting in easy connection to the socket.

Finally, after completing other production steps such as marking, the insulating support member as well as the end portion of each lead is cut off to obtain a semiconductor device which has the same shape as a conventional one. In the case where the leads are not yet subjected to forming or shaping, it is desirable that the forming is performed prior to or simultaneously with the removal of the insulating support member 3 and the end portion of the lead to assuredly perform the forming. Even if the leads are already subjected to the forming, the leads are subjected to the forming again in order to make sure and then the support member portion is cut off, thereby obtaining a semiconductor device with a higher alignment. Otherwise, in the case where the semiconductor device is shipped with the insulating support member 3 retained, the production process terminates in only forming or shaping.

In the above embodiment, the insulating support member is formed simultaneously with the molding of the resin portion to avoid an increase in production steps particularly. The insulating support member can be formed by applying an insulating tape such as polyimide film to the leads or making a thermosetting resin or an adhesive to secure to the leads when the lead frame is not yet mounted with a chip or at any step prior to cutting off the leads.

Further, although the above embodiment is described with reference to an example of QFP (Quarter Flat Package), the present invention is equally applicable to a package of any other type such as SOP (Small Outline Package).

As has been described, according to the present invention a semiconductor device with improved coplanarity of leads alignment can be obtained even if the leads are each very thin and aligned with fine pitch. Such a semiconductor device can be assuredly mounted on a printed board or the like with ease together with mounting the semiconductor device on the printed board type components, thereby contributing to acquisition of a highly reliable electronic device.

Further, since deformation of the leads is hard to occur in the production process or since the semiconductor device can be used with its leads finally shaped by cutting off the insulating support member portion just before the use or with the insulating support member retained, sampling inspection is sufficient to check the coplanarity of leads without necessitating 100% inspection therefor; accordingly, a large number of expensive equipments are not needed while at the same time the number of inspection steps can be considerably reduced, resulting in a great contribution to a decrease in production cost.

Still further, since there is no need to repeatedly reform rather deformed leads, the leads are free from crack and damage of the sheath thereof due to stress. In addition, forming or reforming can be assuredly achieved to thereby substantially improve the production yield, hence greatly contributing to cost reduction.

Though several embodiments of the present invention described above, it is to be understood that the present invention is not limited to the above-mentioned embodiments, and various changes and modifications may be made in the invention without departing from the spirit and scope thereof.

What is claimed is:

1. A semiconductor device comprising:

a semiconductor chip;

a plurality of leads each electrically connected at one end thereof to said semiconductor chip;

a synthetic resin portion which encapsulates said semiconductor chip and said one end of said leads; and an insulating support and distortion preventing member formed of a same synthetic resin as said synthetic resin portion, said insulating support and distortion preventing member having a thickness larger than a thickness of each of said leads, another end of said leads being bent to have a gull-wing like shape extending outwardly from said synthetic resin portion, and said insulating support and distortion preventing member provided in a flat portion of said leads, said flat portion located closer to said synthetic resin portion than a bottom soldering face of said leads having said gull-wing like shape, said leads being fixed to each other.

2. A semiconductor device comprising:

a semiconductor chip;

a plurality of leads each electrically connected at one end thereof to said semiconductor chip;

a synthetic resin portion which encapsulates said semiconductor chip and said one end of said leads; and an insulating support and distortion preventing member having a thickness larger than a thickness of each of said leads, another end of said leads extended outwardly from said synthetic resin portion, and said insulating support and distortion preventing member formed integrally with said synthetic resin portion at a root portion of said leads, which extend from the synthetic resin portion, said leads provided on said insulating support and distortion preventing member, and said insulating support and distortion preventing member made of a same material as that of said synthetic resin portion encapsulating said semiconductor device, said leads being connected to each other at said root portion only by said insulating support and distortion preventing member.

3. A semiconductor device of claim 2, wherein said insulating support member, formed integrally with said resin portion, is provided with a notch portion.

4. A semiconductor device comprising:

a semiconductor chip;

a plurality of leads each electrically connected at end thereof to said semiconductor chip;

a synthetic resin portion which encapsulates said semiconductor chip and said first end of said leads; and an insulating support and distortion preventing member formed of a same material as said synthetic resin portion, said insulating support and distortion preventing member having a thickness larger than a thickness of each of said leads, a second end of said leads being similarly bent to have a gull-wing like-shape extending outwardly from said synthetic resin portion, a tip portion of said second end of said leads being further bent upwardly forming an up-bend end having a tip, said insulating support and distortion preventing member provided on said up-bent end of said leads and said insulating support and distortion preventing member located a predetermined distance from said tip, said leads being fixed to each other.

5. A semiconductor device comprising:

a semiconductor chip;

a plurality of leads each electrically connected at a end thereof to said semiconductor chip;

a synthetic resin portion which encapsulates said semiconductor chip and said first end of said leads; and an insulating support member, a second end of said leads being bent to have a gull-wing like shape extending outwardly from said synthetic resin portion, and said insulating support member formed of a solidified material and provided on a front side of a flat bottom portion of said leads in said gull-wing like shape, said leads being fixedly connected to each other by means of said insulating support member, said insulating support member is formed with one of a) a concave portion and b) a convex portion over an entire width in a space between two adjacent said leads to enlarge a distance between said leads thereby avoiding a short-circuit by a solder bridge.

* * * * *